United States Patent [19]

Yamanaka et al.

[11] Patent Number: 5,629,269
[45] Date of Patent: May 13, 1997

[54] PROCESS FOR FORMING OXIDE SUPERCONDUCTING FILMS WITH A PLURALITY OF METAL BUFFER LAYERS

[75] Inventors: Kazunori Yamanaka, Sagamihara; Takuya Uzumaki, Kawasaki; Nobuo Kamehara, Isehara; Koichi Niwa, Tama, all of Japan

[73] Assignee: Fujitsu Limited, Kawasaki, Japan

[21] Appl. No.: 332,479

[22] Filed: Oct. 31, 1994

Related U.S. Application Data

[63] Continuation of Ser. No. 972,714, Nov. 6, 1992, abandoned, which is a continuation of Ser. No. 734,095, Jul. 23, 1991, abandoned, which is a continuation of Ser. No. 469,789, Jan. 24, 1990, abandoned.

[30] Foreign Application Priority Data

Jan. 24, 1989 [JP] Japan ................... 1-013117

[51] Int. Cl.$^6$ .............................. B05D 5/12; B05D 1/32
[52] U.S. Cl. ............... 505/471; 505/236; 505/237; 505/741; 427/62; 427/123; 427/404; 427/405; 427/419.2; 427/282
[58] Field of Search ............................ 505/471, 470, 505/741, 742, 500, 501, 236, 237; 427/62, 63, 282, 226, 125, 123, 404, 405, 419.2

[56] References Cited

U.S. PATENT DOCUMENTS

| | | | |
|---|---|---|---|
| 4,461,785 | 7/1984 | Oswald, Jr. | 427/45.1 |
| 4,940,693 | 7/1990 | Shappirio et al. | 505/1 |

FOREIGN PATENT DOCUMENTS

| | | |
|---|---|---|
| 0303083 | 2/1989 | European Pat. Off. |
| 0312015 | 4/1989 | European Pat. Off. |
| 63-279521 | 11/1988 | Japan |
| 63-305574 | 12/1988 | Japan |
| 64-6322 | 1/1989 | Japan |
| 1-206675 | 8/1989 | Japan |

OTHER PUBLICATIONS

Brousse et al, Appl. Phys. A 49, pp. 217–220 (1989).

Chien et al, "Effect of noble metal buffer layers on superconducting YBa$_2$Cu$_3$O$_7$ thin films", Appl. Phys. Lett. 51(25) Dec. 1987 pp. 2155–2157.

Hoshino et al, "Preparation of Superconducting Bi–Sr–Ca–Cu–O printed thick films on MgO substrate and Ag metal tape" Jpn. J. Appl. Phys. 27(7) Jul. 1988 L1297–L1299.

Hakuraku et al "Superconducting Thin Films of Bi–Pb–Sr–Ca–Cu–O by dc Magnetron Sputtering from a Single Target" Jpn J. Appl. Phy 27(11) Nov. 1988 L2091–2093.

Miura et al "Epitaxial Y–Ba–Cu–O films on Si with intermediate layer by rf magnetron sputtering" Appl. Phys. lett. 53(20) Nov. 1988 pp. 1967–1969.

Gurvitch et al "Preparation and substrate reactions of superconducting Y–Ba–Cu–O films" Appl. Phys. lett. 51(13) Sep. 1987 pp. 1027–1029.

Hatta et al "Pt–coated substrate effect on oxide superconductive films in low–temperature processing" Appl. Phys letter 53(2) Jul. 1988 pp. 148–150.

(List continued on next page.)

*Primary Examiner*—Roy V. King
*Attorney, Agent, or Firm*—Staas & Halsey

[57] ABSTRACT

Disclosed is a process for forming a super-conducting film, which a multi-layer metal film (buffer film) is formed at a specific temperature on a ceramic substrate and a superconducting film is formed at a specific temperature on the multi-layer metal film. According to this process, a superconducting film having a high critical temperature can be formed over the ceramic substrate while controlling or suppressing the occurrence of a chemical reaction between the substrate and the superconducting film, and required superconducting performances can be manifested or exhibited.

20 Claims, 4 Drawing Sheets

OTHER PUBLICATIONS

M. Takano et al., "High–Tc Phase Promoted and Stabilized in the Bi, Pb–Sr–Ca–Cu–O System", Japanese Journal of Applied Physics, vol. 27, No. 6, Jun. 1988, pp. L1041–L1043.

J. Akimitsu et al., "Superconductivity in the Bi–Sr–Cu–O System", Japanse Journal of Applied Physics, vol. 26, No. 12, Dec. 1987, pp. L2080–L2081.

C. Michel et al., "Superconductivity in the Bi–Sr–Cu–O System", Z. Phys. B —Condensed Matter, vol. 68 (1987), pp. 421–423.

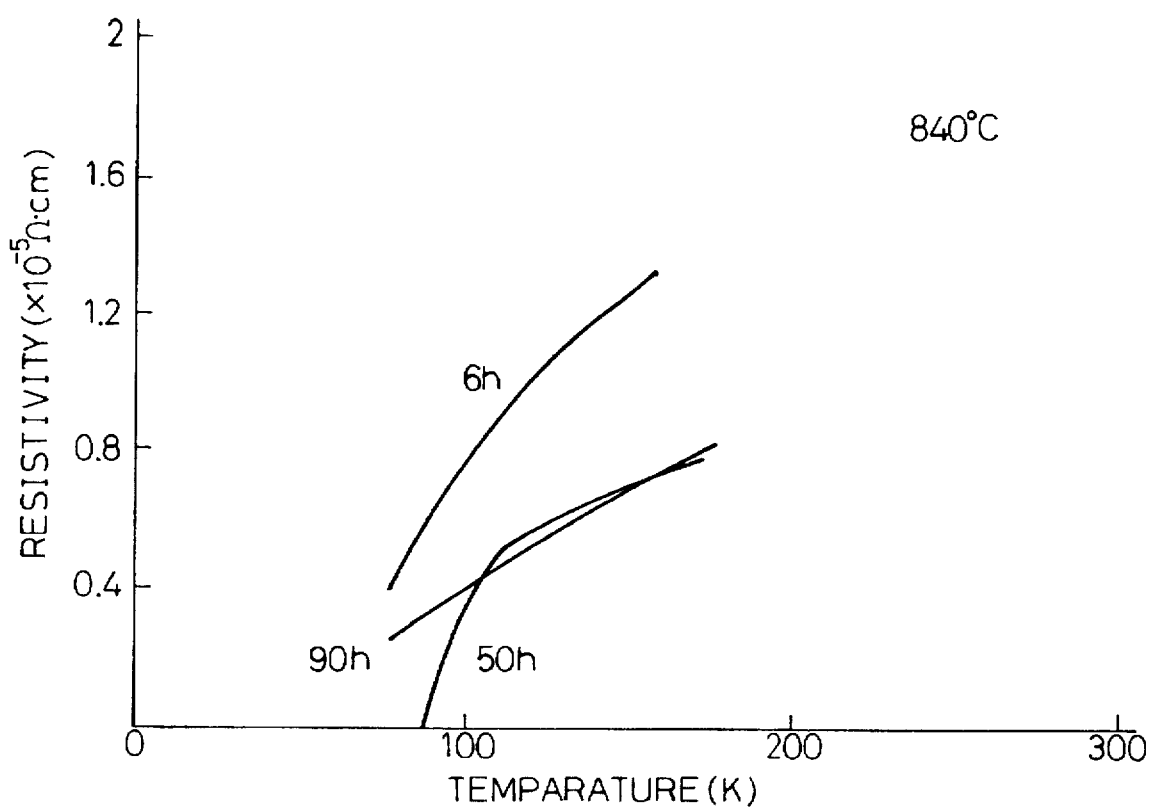

PROCESS FOR FORMING OXIDE SUPERCONDUCTING FILMS WITH A PLURALITY OF METAL BUFFER LAYERS

This application is a continuation of application Ser. No. 7/972,714, filed Nov. 6,1992, now abandoned, which is a continuation of application Serial No. 07/734,095, filed Jul. 23, 1991, now abandoned, in turn a continuation of application Ser. No. 07/469,789, filed Jan. 24, 1990, now abandoned.

BACKGROUND OF THE INVENTION

1. Field of the Invention

The present invention relates to a process for forming a superconducting film. More particularly, the present invention relates to a process comprising forming a plurality of metal layers (buffer layers) on a ceramic substrate and forming a wiring pattern of an oxide superconductor on the buffer layers.

2. Description of the Related Art

As methods of forming a wiring pattern on a ceramic substrate for the circuit board (to interconnect between electronic elements) to be used for an electronic apparatus, there can be mentioned a method comprising forming a thin film on the substrate by vacuum deposition or the like and forming a wiring pattern by the etching technique, and a method comprising forming a wiring pattern on the substrate by using a paste composed mainly of a wiring conductor, by the printing technique, and firing the printed pattern to form a thick film pattern. As the material of the film, there can be mentioned not only normal conductors such as Cu and Mo but also superconductors such as Nb, Y—Ba—Cu—O type (Ref. M. K. Wu, L. R. Ashburn, C. J. Trong, P. H. Hor, R. L. Meng, L. Gao, Z. J. Huang, Y. Q. Wang, and C. W. Chu: Phy. Rev. Lett., 58, (1987) 908) and Bi—Sr—Ca—Cu—O type discovered by H. Maeda et al. (Ref. H. Maeda, Y. Tanaka, M. Fukutomi, and T. Asano: Jpn. J. Appl. Phys. 27 (1988) L209) and Bi—Pb—Sr—Ca—Cu—O was reported by M. Takano et al. (Ref. M. Takano, J. Takada, K. Oda, H. Kitaguchi, Y. Miura, Y. Ikeda; Y. Tomii, and H. Mazaki: Jpn. Appln. Phys: 27(1988) L 1041). Nevertheless, when a film of a conductor such as the above-mentioned normal conductor or superconductor is formed on the substrate, the intended substance does not have a homogeneous composition, due to a mutual reaction between the film and substrate, for example, a chemical reaction, and thus sometimes the intended performance, especially of the superconductor, is not obtained.

A superconducting film device resembling the superconducting film prepared according to the process of the present invention is known (Japanese Unexamined Patent Publication No. 63-279521), but this device is prepared by forming a metal film having a thermal expansion coefficient of at least $10 \times 10^{-6}$/K in both directions on a ceramic substrate, and forming a covering film of a perovskite type metal oxide super-conductor. This known technique is different from the process of the present invention in that, in this known technique, to prevent a formation of cracks in the coating film of the superconductor, a conductor layer of a metal having a specific thermal expansion coefficient is interposed between the ceramic substrate and the superconductor layer.

Japanese Unexamined Patent Publication (Kokai) No. 63-305574 (Publication Date: Dec. 13, 1988) discloses a superconducting substrate for forming a superconductor on a supporting substrate comprising a composite substrate with a stabilizing material which does not react chemically, interposed between the supporting substrate and the superconductor.

Japanese Unexamined Patent Publication No. 63-305574 also discloses the formation of a superconducting film of the Y—Ba—Cu—O system, which comprises forming the metal (Pt, Pd, Ag, Au) layer by a deposition, sputtering, flame spaying or plating process, and the like, on the $Al_2O_3$ substrate, and forming the superconducting film on thus-obtained metal layer. There is no disclosure or suggestion therein that the double layer of the above metal layer is formed as a stabilizing material.

Therefore, this conventional technique is clearly different from the present invention in object and structure.

SUMMARY OF THE INVENTION

A primary object of the present invention is to form a uniform superconducting film on a ceramic substrate while controlling the occurrence of a chemical reaction between the ceramic substrate and the superconducting film.

Another object of the present invention is to form a superconducting film on a ceramic substrate through at least two intermediate metal layers while preventing or controlling a formation of pinholes in the metal layers by forming the metal layers by a specific method.

The present inventors carried out research with a view to realizing the foregoing objects, and as a result found that, when forming a film of a superconductor on a ceramic substrate, if a plurality of layers of a buffer substance which substantially does not react with the substance of the superconducting film are formed between the substrate and the superconducting film by a specific method, the occurrence of a chemical reaction between the substrate and the superconducting film can be effectively controlled, prevented or avoided. The present invention is based on this finding.

More specifically, in accordance with the present invention, there is provided a process for forming a superconducting film, which comprises forming a film of a metal of the group Ib (copper group Cu, Ag, Au) or the group VIII (Fe, Co, Ni, Ru, Rh, Pd, Os, Ir, Pt) on a ceramic substrate and forming an oxide superconducting film on the metal film, wherein the metal film has a multi-layer structure having at least two layers composed of the same metal or of two or more different metals, respectively, the formation of the multi-layer metal film is carried out at a temperature higher than the temperature adopted for the formation of the superconducting film, and the formation of the superconducting film is carried out at a temperature within a range at which a crystal of the superconductor can be grown.

BRIEF DESCRIPTION OF THE DRAWINGS

These objects and advantages of the present invention are made clear by the following description of preferred embodiments of the present invention with reference to the accompanying drawings, wherein.

DESCRIPTION OF THE PREFERRED EMBODIMENTS

Figure 1:
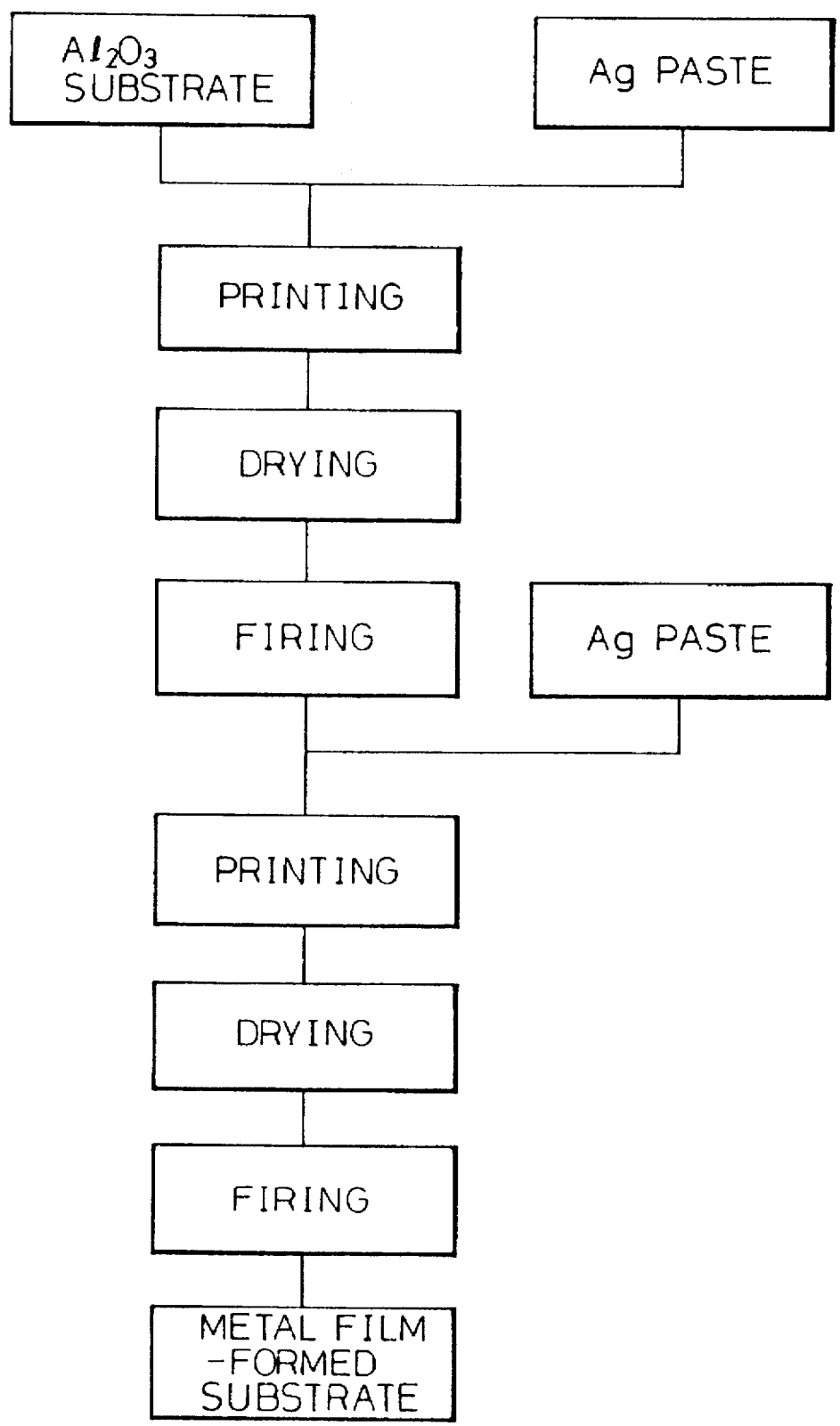
FIG. 1 is a step diagram illustrating an embodiment of the present invention.

As is apparent from the foregoing description, the process of the present invention comprises the step of forming a multi-layer metal film (buffer layer) of at least two layers on a ceramic substrate such as an alumina substrate or $Y_2O_3$ stabilized zirconia substrate, and the step of forming a film of an oxide superconductor on the metal film. These steps will now be described in detail, respectively.

At the step of forming the multi-layer metal film having at least two layers, the following materials are used as the metal film-constituting material. As the material of the first metal film layer formed on the ceramic substrate, there can be mentioned metals of the group Ib, and elements having the same crystal structure as that of the metals of the group Ib and having an atomic number adjacent to those of metals of the group Ib, for example, elements of the group VIII, i.e., metals of the iron group (such as Fe, Co and Ni) and metals of the platinum group (such as Pd and Pt). A metal that can be bonded to a metal of the group Ib through oxygen, for example, Cr, also can be used.

The requirements of the present invention are met if the metal constituting the second metal film layer formed on the first metal film layer is a metal that can adhere closely to the metal of the first metal film layer. More specifically, this metal is selected from the above-mentioned metals and can be the same as or different from the metal of the first metal film layer.

Furthermore, as the element of the metal layer, a metal that has little influence on the oxide superconductive material, or has no influence on the appearance of the superconducting phase even if slightly substituted, can be used.

When employing Cu, Fe, Co, Ni and the like as the element of the metal layer, an inert gas atmosphere is employed as a firing environment in which the metal layer is formed.

Furthermore, as the firing environment in which the superconducting phase is formed, an oxidizing environment such as the atmosphere can be employed. In this case, the upper metal layer might be oxidized, but even in such a case, an element of the metal layer which does not react with the superconductive material on or over the metal layer can be employed.

The first metal film layer is formed on a ceramic substrate such as an alumina substrate by printing, drying and firing a paste (free of frit glass) composed only of an organic substance and a metal powder. After the firing, a paste of a metal which is the same as or different from the metal of the first metal film layer is printed and fired on the formed first metal film layer, whereby a ceramic substrate having at least two metal film layers formed thereon can be prepared. This multi-layer metal film acts as a buffer layer.

An oxide superconductor, or a composition thereof, is deposited on the buffer layer and is then heat-treated to obtain a superconducting film.

It was found that, even if a metal film substance that substantially does not react with a superconducting substance is discovered, according to the state of the material texture of this metal film, the formation of a superconductor is sometimes inhibited.

To realize the objects of the present invention, the firing temperature adopted for the formation of the metal film must be higher than the sintering temperature of the oxide superconductor. This is because, if the firing temperature for the formation of the metal film is equal to or lower than the firing temperature of the oxide superconductor, the energy state, which is used mainly for sintering, in the vicinity of the surface of the metal constituting the metal film is often higher than the energy state obtained by a high-temperature firing. In this case, during the heat treatment of the oxide superconductor, the metal in the metal film causes a mass transfer, which causes a fluctuation of the composition of the superconducting film, and a manifestation of the superconductivity is inhibited. Also the formation of the superconducting film must be carried out at temperatures within a range at which a crystal of the superconductor can be grown.

If the sintering is carried out at a temperature outside the above-mentioned range, the growth of the crystal of the superconducting substance is inhibited, and the superconductivity having a predetermined critical temperature is not manifested.

To prepare a high-temperature superconducting film having good superconducting characteristics, preferably a temperature at which the superconducting film is melted is adopted for the heat treatment. In this case, if pinholes exist in the buffer layer, a part of the molten composition for obtaining the superconductivity migrates to the ceramic substrate, and as a result, the composition is fluctuated and a good superconducting film cannot be obtained.

According to the present invention, by forming a multi-layer metal film (buffer layer) comprising at least two metal film layers, and carrying out the formation of the metal film at a firing temperature higher than the firing temperature for the formation of the oxide superconductor, a diffusion of the super-conducting substance into the buffer layer, and in consequence to the substrate, does not occur during the firing for forming the superconducting film (that is, the mass transfer to the buffer layer and to the substrate is controlled or prevented), and a good superconducting layer can be formed. It is considered that this is because the formation of pinholes in the buffer layer is prevented and the number of intergranular pores in the buffer layer is reduced.

The firing temperature for forming the superconducting film on the substrate is selected from a range at which a crystal of the superconductor can be grown, as described hereinafter, and therefore, this firing temperature is changed in accordance with the superconductor-forming composition.

The present invention will now be described in detail with reference to the following examples, that by no means limit the scope of the invention.

EXAMPLE

Example 1

Figure 2:
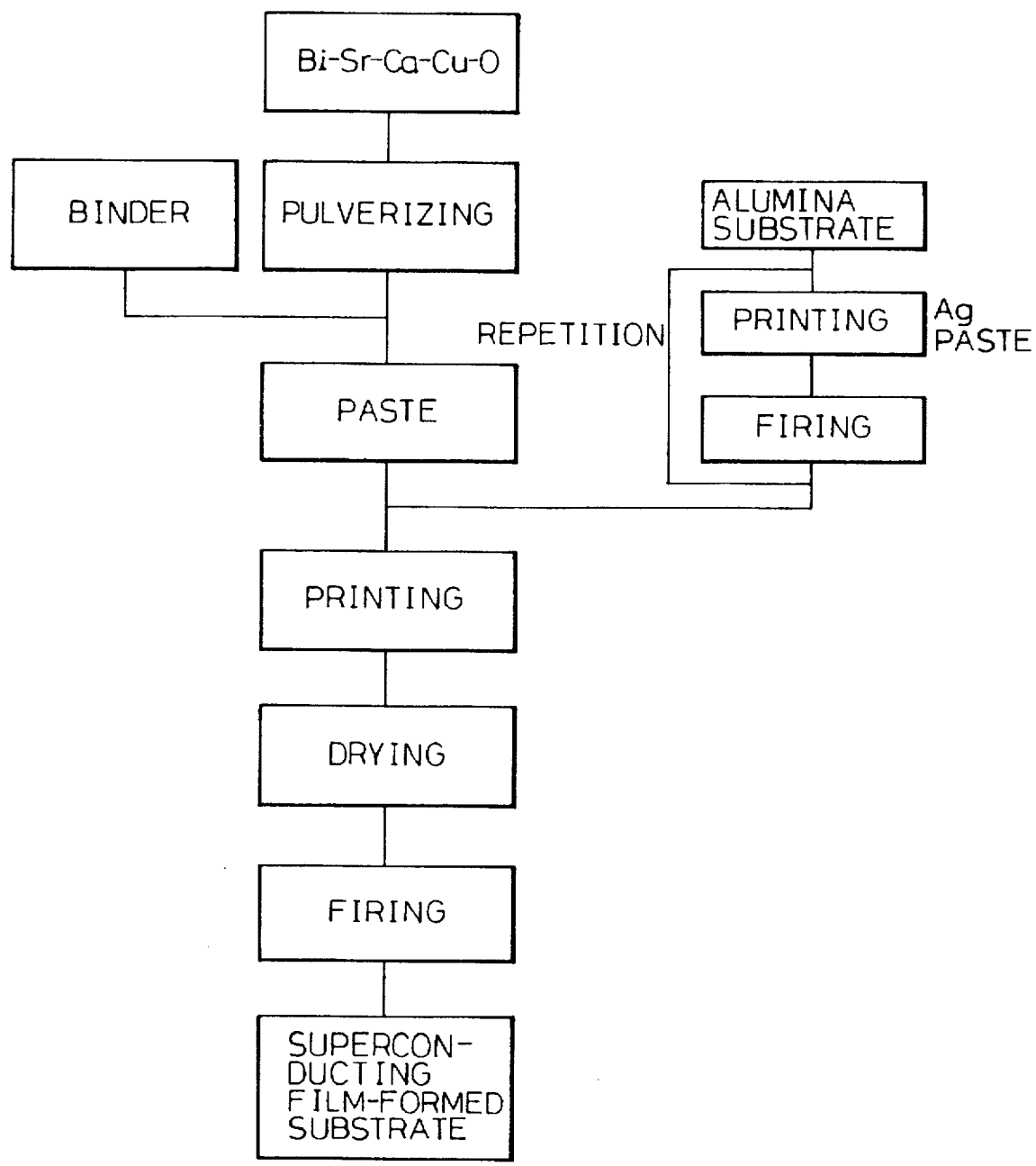
FIG. 2 is a step diagram illustrating an embodiment of the process for preparing a metal film-formed substrate according to the present invention.

The steps of the process of the present invention are illustrated in brief in FIGS. 1 and 2. FIG. 1 shows the steps of preparing a metal film-formed substrate, and FIG. 2 shows the step of forming a superconducting film over an alumina substrate.

An Ag paste comprising Ag powder having an average particle size of 1 μm and a purity higher than 99.9%, and an organic substance (a solvent and an organic resin; the parts by weight of the organic resin is 0.8 to 100 parts by weight of Ag powder) as a vehicle, was printed on an $Al_2O_3$ substrate having a purity of 99.7%. The printed substrates were dried at 110° C., and fired at various conditions at temperatures between 800° and 970° C. for 10 minutes in air. The Ag paste was printed and dried on the fired Ag film in the same manner as described above and then fired to obtain a metal film-formed substrate (see FIG. 1). The thickness of the metal film is not less than several μm, preferably more than 10 μm to avoid the formation of pinholes in the metal layer, as an uneven metal layer is formed when the thickness of the metal layer is thinner than several μm.

The total thickness of all of the metal layers obtained by a plurality of printing and firing processes is more than 20 μm. In this example, the thickness of the Ag layer formed by the first firing is ten μm, and the total thickness of the Ag layer obtained by coating and firing the second Ag paste is 20 μm. In the case of using the substrate fired at 800° C. for firing the metal layer, when the firing of a superconducting film described hereinafter is conducted, a component of the superconducting substance migrated into the alumina substrate through the Ag film. On the other hand in the case of using the substrate fired at 900° to 955° C. for firing the metal layer, diffusion of a component of the superconducting substance into the substrate was not detected at the firing described hereinafter; and in the case of using the substrate fired at a temperature higher than about 960° C. for firing the metal layer, Ag was melted and no film was formed on the substrate because of the surface tension.

The substrate which had been fired twice at a high temperature for forming metal layers on the substrate, as shown in FIG. 1, was used for the operations of the following steps.

A high-temperature superconducting film was prepared in the following manner.

In the case of the Bi—Pb—Sr—Ca—Cu—O system (the final amount of Pb was very small or not detected), a bulk for a high-temperature superconductor having a critical temperature of the 110 K class was prepared. As one example of the Bi—Pb—Sr—Ca—Cu—O system, $Bi_{0.7} Pb_{0.3} Sr_1 Ca_1 Cu_{1.8} O_{9.15}$ was used in this example. This bulk sample was roughly pulverized in a mortar and further pulverized in a ball mill to obtain a powder having an average particle size smaller than about 10 μm; the powder was mixed and kneaded with a vehicle composed of organic substances to prepare a paste composed mainly of a powder of the Bi—Pb—Sr—Ca—Cu—O system; this paste was printed and dried both, on an alumina substrate without buffer layers and also on a metal film-formed alumina substrate fired at about 900° C. for forming the metal layer, and the substrates printed with the paste of the superconducting substance (or superconductor forming substance) were fired in air to prepare superconducting film-formed substrates (see FIG. 2). The firing temperature was within a range in which a crystal of a superconductor can be grown. The thickness of the superconducting film to be formed is 5 to 100 μm, although this depends on the mesh size during screen printing. In this example, a superconducting layer having a thickness of about 80 μm was formed. In the case of the Bi—Pb—Sr—Ca—Cu—O system, this temperature range is from 830° to 860° C. Accordingly, in Examples 1 through 4 of the present invention, as shown in Table 1 given hereinafter, the firing was carried out at 840° C., although the firing was carried out at 870° C. in Comparative Example 1. Note, in Comparative Example 2, the metal film was not formed on the substrate.

When the sample of Comparative Example 1 was analyzed by the X-ray diffractometry using Cu Kα radiation, Ag, Bi—Sr—Cu—O superconducting phase with the Tc of about 10 K, CaO and CuO were detected on the film surface, and the peak of the crystal of the high-Tc phase of the superconductor having the critical temperature of the 80 K or 110 K class of the Bi—Sr—Ca—Cu—O system was not detected.

References on the Bi—Sr—Cu—O superconducting phase are as follows:

(1) J. Akimitsu, A. Yamazaki, H. Sawa and H. Fujiki: Jpn. J. Appln. Phys. 26 (1987) L2080.

(2) C. Michel, M. Hervier, H. M. Borel, A. Grandin, F. Deslandes, J. Provost and B. Raveau: Z. Phys. B68 (1987) 421.

Figure 3:
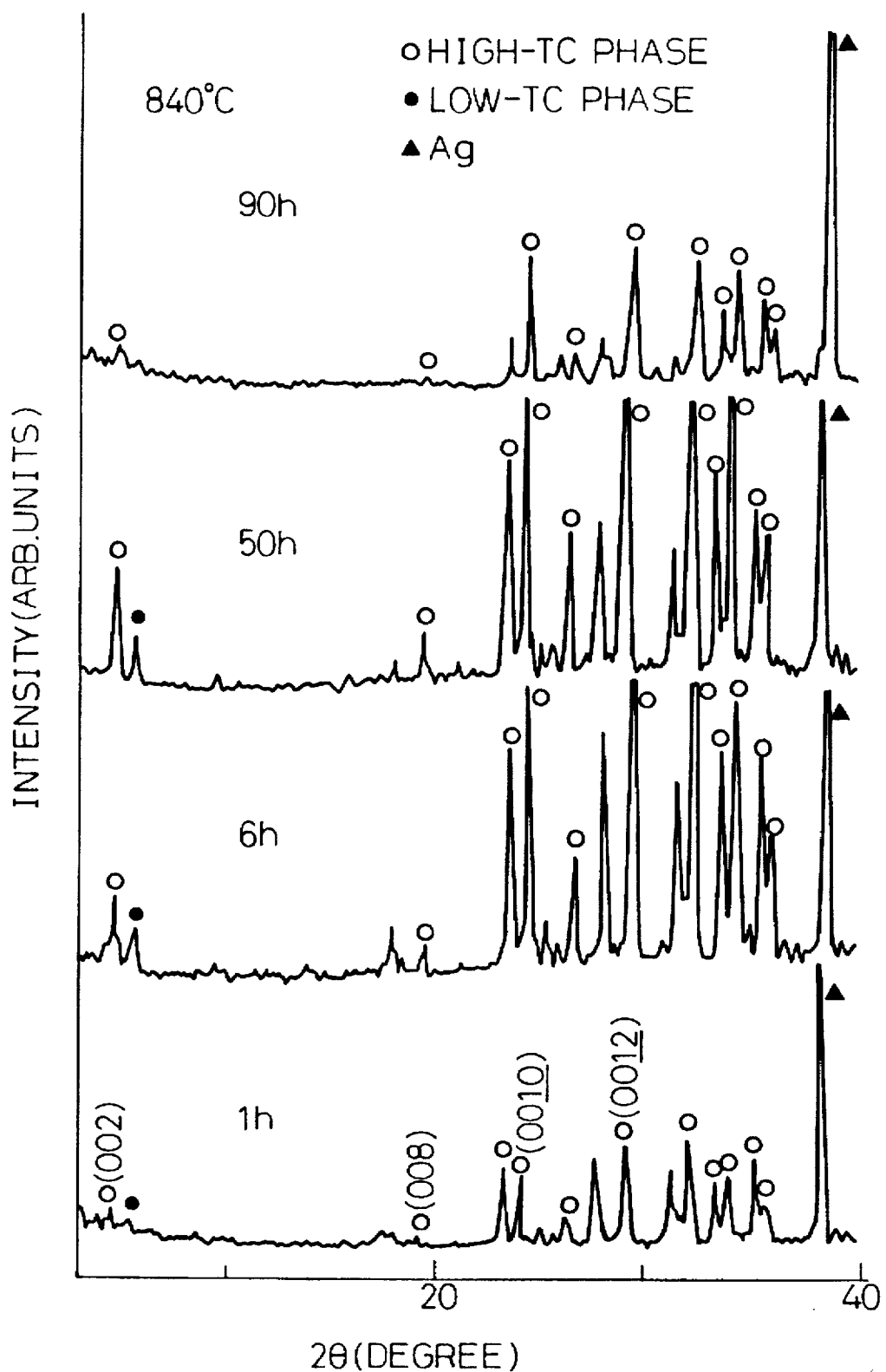
FIG. 3 shows an X-ray diffraction pattern of a sample obtained according to the process of the present invention; and, FIG. 4 is a graph illustrating the temperature dependency of the electric resistivity of a sample obtained according to the process of the present invention.

X-ray diffraction patterns of the samples of Examples 1 through 4 are shown in FIG. 3. In each sample, peaks of crystals of the low-Tc (indicated in FIG. 3 by a solid, or black, circle), and after "high-Tc" (indicated in FIG. 3 by an open circle) and high-Tc phases of the superconductor having the critical temperature of the 80 K or 110 K class were detected. From the results obtained when the firing time was conducted for 1, 6 or 50 hours, it is seen that, as the firing time is made longer, the peaks corresponding to the superconducting crystal having the critical temperature of 110 K class tends to increase, but when the firing time was 90 hours, the peaks decreased. FIG. 4 shows the temperature dependency of the electric resistivity in the samples of Examples 2 through 4. In the sample of Example 3, a superconducting film in which the Tce (Tc end point) was about 90 K was formed, and in the sample of Comparative Example 2, the reaction with the substrate was observed but the transition to the superconductor was not observed.

TABLE 1

| Sample | Ag Metal Film | Firing Temperature (°C.) | Firing Time (hours) |
|---|---|---|---|
| Comparative Example 1 | formed | 870 | 1 |
| Example 1 | formed | 840 | 1 |
| Example 2 | formed | 840 | 6 |
| Example 3 | formed | 840 | 50 |
| Example 4 | formed | 840 | 90 |
| Comparative Example 2 | not formed | 840 | 1 |

Example 2

An example using a $Y_2O_3$ -partially-stabilized zirconia substrate as the ceramic substrate will now be described.

An Ag paste composed of Ag powder having an average particle size of 1 μm and a purity higher than 99.9% and a vehicle formed of organic substances was printed on a zirconia substrate and dried at 110° C., and firing was carried out at temperatures between 900° and 960° C. in air for 10 minutes. The Ag paste was printed and dried on the fired Ag film and was then fired to obtain a zirconia substrate having two metal layers formed thereon. A bulk for a high-temperature superconductor of the Bi—Pb—Sr—Ca—Cu—O system having a critical temperature of the 110 K class was prepared. This bulk sample was roughly pulverized in a mortar and further pulverized in a ball mill to obtain a powder having an average particle size smaller than about 10 μm; the powder was mixed and kneaded with a vehicle composed of organic substances to form a paste comprising as the main component a powder of the Bi—Pb—Sr—Ca—Cu—O system; the paste was printed and dried, both on the zirconia substrate without metal layers and also on the zirconia substrate having two metal layers formed thereon, and firing was carried out at 840° to 860° C. in air.

The sample obtained by carrying out printing, drying and firing directly on the zirconia substrate had a poor adhesion of the formed film to the substrate and the Bi—Pb—Sr—

Ca—Cu—O film was easily peeled off. Furthermore, the resistivity remained at about 77 K. On the other hand, in the sample obtained by carrying out printing the paste of the superconducting substance (or superconductor forming substance), drying and firing on the metal layers, little peeling of the Bi—Pb—Sr—Ca—Cu—O film occurred, and a superconducting film having a Tce of about 110 K and a Tce of about 90 K was formed.

The present invention has been described with reference to embodiments in which the intermediate metal film (buffer layer) comprises two layers. In the present invention, however, a method can be adopted in which a third metal film composed of a metal having a good adherence to the metal of the above-mentioned second metal film is formed on the second metal film to form a buffer layer having a three-layer structure.

Example 3

Au paste instead of Ag paste was employed as the metal layer and was subjected to the same process as in Example 1, except that the firing of the Au paste printed substrate was carried out at 900° C., to obtain the same results as obtained in Example 1.

As is apparent from the foregoing description, according to the process of the present invention having the above-mentioned structure, a superconducting thick film having a high critical temperature can be formed by using a ceramic material as a substrate. Furthermore, since a metal having a normal conductivity is used as the material of the buffer layer, this buffer layer can be used as a medium for maintaining a good connection between a normal conductor and a superconducting film, and accordingly, required conductor performances can be manifested.

We claim:

1. A process of forming an oxide superconducting film on a multi-layer metal film which comprises:

providing an alumina substrate having a main surface;

forming a multi-layer metal film of at least two metal layers on the main surface of the alumina substrate and comprising at least two Ag layers, each said metal layer being formed of one or more metals selected from the group consisting of Cu, Ag, Au, Ni, Pd, Pt, Rh and Ir, each of said one or more selected metals for each respective metal layer being provided as one or more corresponding metal powders in a paste composed only of said one or more selected and corresponding metal powders and an organic substance and said metal layers being formed in individual succession, each thereof by printing and drying the paste and then firing the paste at a first temperature within a first temperature range of from 900° C. to 950° C., said at least two metal layers of said multi-layer metal film including at least a bottom metal layer formed on and fixedly adhered to the main surface of the alumina substrate and at least a top metal layer having an uppermost exposed surface, each successive metal layer being formed on and fixedly adhered to the respectively underlying metal layer and the total thickness of the multi-layer film being more than 20 μm; and forming an oxide superconducting film, the material thereof consisting of a Bi—Pb—Sr—Ca—Cu—O system, on the uppermost, exposed surface of the top metal layer of the multi-layer metal film by printing a paste of the oxide superconducting film material thereon and firing same at a second temperature, within a second temperature range of from 830° C. to 860° C. and at which a crystal of the material of the oxide superconducting film is grown, the oxide superconducting film having a superconducting critical temperature of 90° K. or higher.

2. A process as recited in claim 1, wherein the lower limit of 900° C. of the first temperature range, for formation of the metal layers of the multi-layer metal film, is higher than the sintering temperature of the oxide superconductor material.

3. A process as recited in claim 1, wherein the temperature for forming the oxide superconducting film is the melting temperature of the oxide superconducting film material.

4. A process as recited in claim 1, wherein the upper limit of 860° C. of the second temperature range for forming the oxide superconducting film is less than the lowest melting temperature of the respective materials of the metal layers of the multi-layer metal film.

5. A process as recited in claim 1, further comprising forming each successive metal layer of the multi-layer metal film as a respective, uniform layer of a metallic paste, composed only of said one or more selected and corresponding metal powders and an organic substance, drying the uniform layer of metallic paste, and firing the dried, uniform layer at a temperature within the first temperature range.

6. A process as recited in claim 5, further comprising printing the metallic paste by screen printing.

7. A process as recited in claim 1, further comprising forming the oxide superconducting film by printing a uniform layer of the paste of the oxide superconducting film material, contained therein in powder form, drying the uniform paste layer of oxide superconducting material and firing the uniform, dried layer at a temperature within the second temperature range.

8. A process as recited in claim 7, further comprising printing the metallic paste by screen printing.

9. A process according to claim 1, wherein the multi-layer metal film consists of two Ag layers and each of the Ag layers is formed by firing.

10. A process according to claim 1, wherein the alumina substrate has a purity of 99.7% or higher.

11. A process of forming an oxide superconducting film on a multi-layer metal film which comprises:

providing an alumina substrate having a main surface;

forming a multi-layer metal film of at least two metal layers on the main surface of the alumina substrate and comprising at least two Ag layers, each said metal layer being formed of one or more metals selected from the group consisting of Cu, Ag, Au, Ni, Pd, Pt, Rh and Ir, each of said one or more selected metals for each respective metal layer being provided as one or more corresponding metal powders in a paste composed only of said one or more selected and corresponding metal powders and an organic substance and said metal layers being formed in individual succession, each thereof by printing and drying the paste and then firing the paste at a first temperature within a first temperature range of from 900° C. to 950° C., said at least two metal layers of said multi-layer metal film including at least a bottom metal layer formed on and fixedly adhered to the main surface of the alumina substrate and at least a top metal layer having an uppermost exposed surface, each successive metal layer being formed on and fixedly adhered to the respectively underlying metal layer and the total thickness of the multi-layer film being more than 20 μm; and forming an oxide superconducting film, the material thereof consisting of a Bi—Pb—Sr—Ca—Cu—O system, on the exposed surface of the top metal layer of the multi-layer metal film by printing a paste of the oxide superconducting film material thereon and firing same at a second temperature, within a second temperature range and at which a crystal of the material of the oxide superconducting film is grown and the first temperature being higher than the second temperature and the oxide superconducting film having a superconducting critical temperature of 90° K. or higher.

12. A process as recited in claim 11, wherein the lower limit of 900° C. of the first temperature range, for formation of the metal layers of the multi-layer metal film, is higher than the sintering temperature of the oxide superconductor material.

13. A process as recited in claim 11, wherein the temperature for forming the oxide superconducting film is the melting temperature of the oxide superconducting film material.

14. A process as recited in claim 11, wherein the upper limit of 860° C. of the second temperature range for forming the oxide superconducting film is less than the lowest melting temperature of the respective materials of the metal layers of the multi-layer metal film.

15. A process as recited in claim 11, further comprising forming each successive metal layer of the multi-layer metal film as a respective, uniform layer of a metallic paste, composed only of said one or more selected and corresponding metal powders and an organic substance, drying the uniform layer of metallic paste, and firing the dried, uniform layer at a temperature within the first temperature range.

16. A process as recited in claim 15, further comprising printing the metallic paste by screen printing.

17. A process as recited in claim 11, further comprising forming the oxide superconducting film by printing a uniform layer of the paste of the oxide superconducting film material, contained therein in powder form, drying the uniform paste layer of oxide superconducting material and firing the uniform, dried layer at a temperature within the second temperature range.

18. A process as recited in claim 11, further comprising printing the metallic paste by screen printing.

19. A process according to claim 11, wherein the multi-layer metal film consists of two Ag layers and each of the Ag layers is formed by firing.

20. A process according to claim 11, wherein the alumina substrate has a purity of 99.7% or higher.

* * * * *

UNITED STATES PATENT AND TRADEMARK OFFICE
CERTIFICATE OF CORRECTION

PATENT NO.  : 5,629,269
DATED       : May 13, 1997
INVENTOR(S) : YAMANAKA et al.

It is certified that error appears in the above-indentified patent and that said Letters Patent is hereby corrected as shown below:

TITLE PAGE: [75] Inventors, fourth line, change "Tama" to --Tokyo--.

Col. 3,  line 6, after "substrate" insert --,--.

Col. 4,  line 50, change "EXAMPLE" to --EXAMPLES--.

Col. 5,  line 41, change "both," to --, both--.

Col. 6,  line 11, after "black, circle)" delete ", and after ... FIG. 3 by an" (the remainder of line 11);
line 12, delete "open circle)"; and after "high-Tc" insert --(indicated in FIG. 3 by an open circle)--;
line 59, after "comprising" insert --,--;
line 60, after "component" insert --,--.

Signed and Sealed this

Second Day of September, 1997

*Attest:*

BRUCE LEHMAN

*Attesting Officer*    Commissioner of Patents and Trademarks